(12) United States Patent
Iwai et al.

(10) Patent No.: US 9,661,410 B1
(45) Date of Patent: May 23, 2017

(54) ELECTRONIC DEVICE WITH WASHABLE WATERPROOF FILM PROTECTING AUDIO COMPONENT

(71) Applicant: KYOCERA Corporation, Kyoto-shi, Kyoto (JP)

(72) Inventors: Akito Iwai, Osaka (JP); Satoru Suezawa, Shijonawate (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/199,798

(22) Filed: Jun. 30, 2016

(30) Foreign Application Priority Data

Dec. 22, 2015 (JP) ................... 2015-250383

(51) Int. Cl.
*H04R 9/08* (2006.01)
*H04R 1/08* (2006.01)
(Continued)

(52) U.S. Cl.
CPC ........... *H04R 1/086* (2013.01); *H05K 5/0004* (2013.01); *H05K 5/0217* (2013.01); *H04R 2499/11* (2013.01)

(58) Field of Classification Search
CPC ......... H04M 1/035; H04R 1/02; H04R 1/086; H04R 2201/02; H04R 2499/11
(Continued)

(56) References Cited

U.S. PATENT DOCUMENTS 6,643,529 B1    11/2003    Inoue et al.
2006/0258325 A1*    11/2006    Tsutaichi ............... H04M 1/18
                                                      455/350

(Continued)

FOREIGN PATENT DOCUMENTS

JP    2000-307698 A    11/2000
JP    2010-114548 A    5/2010
(Continued)

OTHER PUBLICATIONS

Machine Tanslation of Miyazaki Japanese Publication No. 2015-061190, Mar. 30, 2015.*

(Continued)

*Primary Examiner* — Paul S Kim
*Assistant Examiner* — Katherine Faley
(74) *Attorney, Agent, or Firm* — Procopio Cory Hargreaves and Savitch LLP

(57) ABSTRACT

An electronic device includes a first housing component including a first surface facing a first side and a second surface facing a second side, the first housing component including a first through-hole connecting the first surface and the second surface, a waterproof film located to cover the first through-hole, an audio component located on the first side of the waterproof film, and a second housing component attached removably to the second side of the first housing component. The first through-hole has such a shape that the waterproof film is directly visible when the first side is seen from the second side without the second housing component attached to the first housing component. The first housing component and the second housing component are combined together to form a passage leading from an end of the first through-hole on the second surface side to a first opening.

8 Claims, 12 Drawing Sheets

(51) Int. Cl.
*H05K 5/00* (2006.01)
*H05K 5/02* (2006.01)

(58) Field of Classification Search
USPC .............................. 381/91, 345, 365; 455/350
See application file for complete search history.

(56) References Cited

U.S. PATENT DOCUMENTS

2016/0014488 A1   1/2016  Iwaya
2016/0299536 A1  10/2016  Mori et al.

FOREIGN PATENT DOCUMENTS

JP    2014-192689 A   10/2014
JP    2015-061190 A    3/2015
WO    2015/097937 A    7/2015

OTHER PUBLICATIONS

Office Action dated Feb. 28, 2017 issued by the Japan Patent Office in counterpart Japanese Application No. 2015-250383.

* cited by examiner

ELECTRONIC DEVICE WITH WASHABLE WATERPROOF FILM PROTECTING AUDIO COMPONENT

CROSS-REFERENCE TO RELATED APPLICATION

The present application claims priority under 35 U.S.C. §119 to Japanese Patent Application No. 2015-250383, filed on Dec. 22, 2015, entitled "Electronic Device." The content of which is incorporated by reference herein in its entirety.

FIELD

The present disclosure relates to an electronic device.

BACKGROUND

A mobile terminal is mentioned as a kind of electronic device. A mobile terminal whose housing includes a through-hole for passing voice therethrough is known.

SUMMARY

An electronic device based on the present disclosure includes a first housing component including a first surface facing a first side and a second surface facing a second side, the first housing component including a first through-hole configured to connect the first surface and the second surface, a waterproof film located to cover the first through-hole, an audio component located on the first side of the waterproof film, and a second housing component attached removably to the second side of the first housing component. The first through-hole has such a shape that the waterproof film is directly visible when the first side is seen from the second side without the second housing component attached to the first housing component. The first housing component and the second housing component are combined together to form a passage leading outward from an end of the first through-hole on the second side.

The foregoing and other objects, features, aspects and advantages of the present disclosure will become more apparent from the following detailed description of the present disclosure when taken in conjunction with the accompanying drawings.

DETAILED DESCRIPTION

Figure 1:
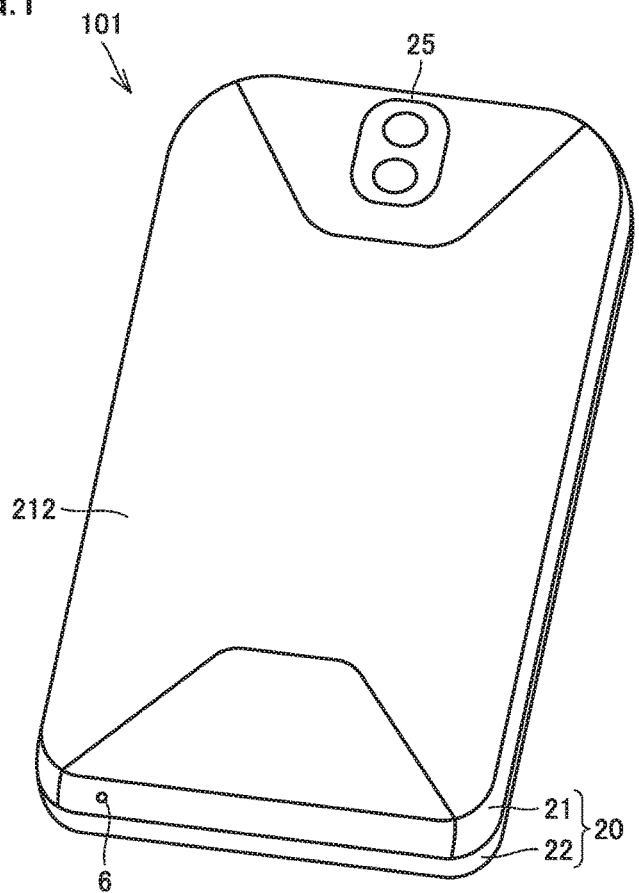
FIG. 1 is a perspective view of an electronic device according to a first embodiment based on the present disclosure.

The dimension ratio shown in the drawings does not necessarily indicate the actual ratio faithfully, but may be exaggerated for ease of description. The concept of an upper or lower side in the following description, if any, does not indicate the absolute upper or lower side, but may indicate a relative upper or lower side in an illustrated posture.

First Embodiment

Referring to FIGS. 1 to 8, an electronic device according to a first embodiment based on the present disclosure will be described. FIG. 1 shows the appearance of the electronic device according to a first embodiment. Although the electronic device will be described here as a smartphone by way of example, the type of electronic device is not limited to a smartphone.

An electronic device 101 may include a display. FIG. 1 shows a surface of electronic device 101 opposite to a surface on which the display is located. Electronic device 101 includes a housing 20. Housing 20 has a generally rectangular contour, for example. Housing 20 includes a housing component 21 on the rear side and a housing component 22 on the front side. Housing component 22 may include openings for the display, buttons and the like. In FIG. 1, housing component 21 on the rear side is mainly visible. Electronic device 101 includes an image capturing unit 25, for example. Image capturing unit 25 includes a camera, a sensor and the like, for example. Housing component 21 includes a first opening 6. In the example shown in FIG. 1, first opening 6 is located on a side surface on the shorter side of housing component 21.

Figure 2:
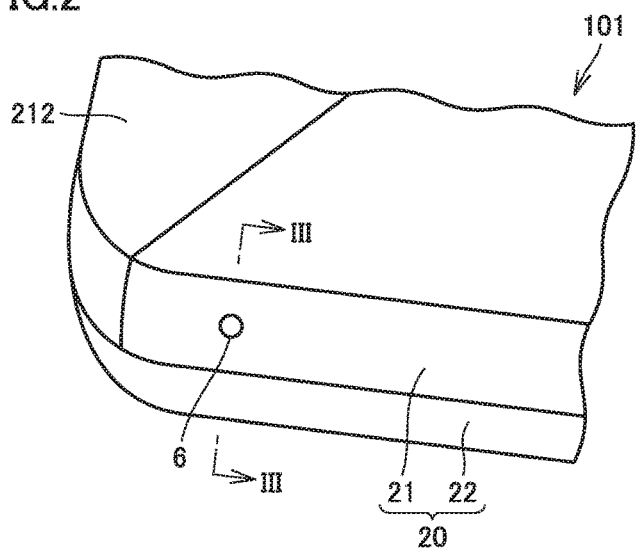
FIG. 2 is a partially enlarged perspective view of and around a first opening formed in the electronic device according to the first embodiment based on the present disclosure.
Figure 3:
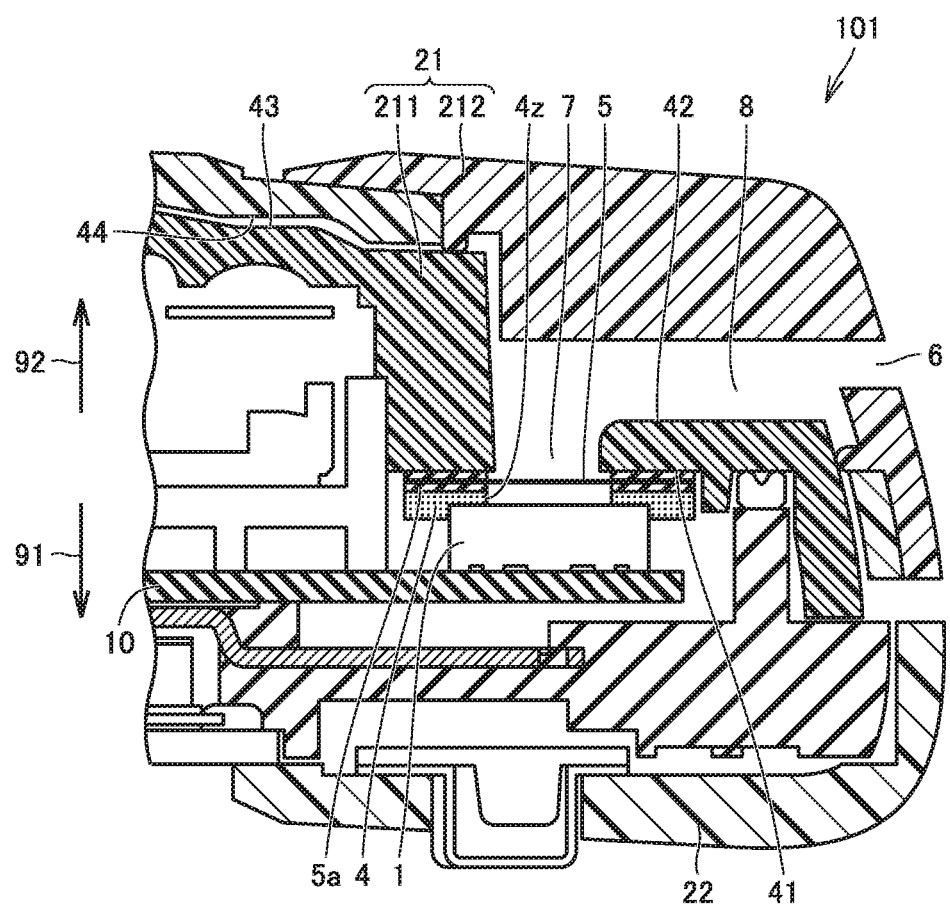
FIG. 3 is a sectional view taken along the line in FIG. 2.

FIG. 2 is an enlarged view of first opening 6 and its surroundings of electronic device 101 shown in FIG. 1. FIG. 3 is a sectional view taken along the line in FIG. 2.

Housing component 21 includes a first housing component 211 and a second housing component 212. In the example shown here, second housing component 212 is formed by double molding. In the space enclosed by housing components 21 and 22, an audio component 1 mounted on a substrate 10 is located. Audio component 1 includes a microphone, for example. Audio component 1 as a whole may be a microphone. Audio component 1 has a cylindrical shape, for example. In the example shown here, audio component 1 is pressed against a circular elastic member 4. When audio component 1 has a cylindrical shape, round circular elastic member 4 is used, for example. Elastic member 4 has a circular contour, and has a circular through-hole 4z at the center. Over elastic member 4, a waterproof film 5 held by a waterproof film holder 5a is located. Waterproof film 5 has characteristics that can pass air and air vibration therethrough, but does not pass water therethrough. Waterproof film 5 can be implemented by a publicly-known technique. Elastic member 4 and waterproof film holder 5a are stacked to form a stack. In the example shown here, the outer diameter of elastic member 4 is almost equal to that of waterproof film holder 5a. The inner diameter of elastic member 4 is almost equal to that of waterproof film holder 5a. The internal space of through-hole 4z of elastic member 4 is a space in contact with the central part of audio component 1.

Figure 4:
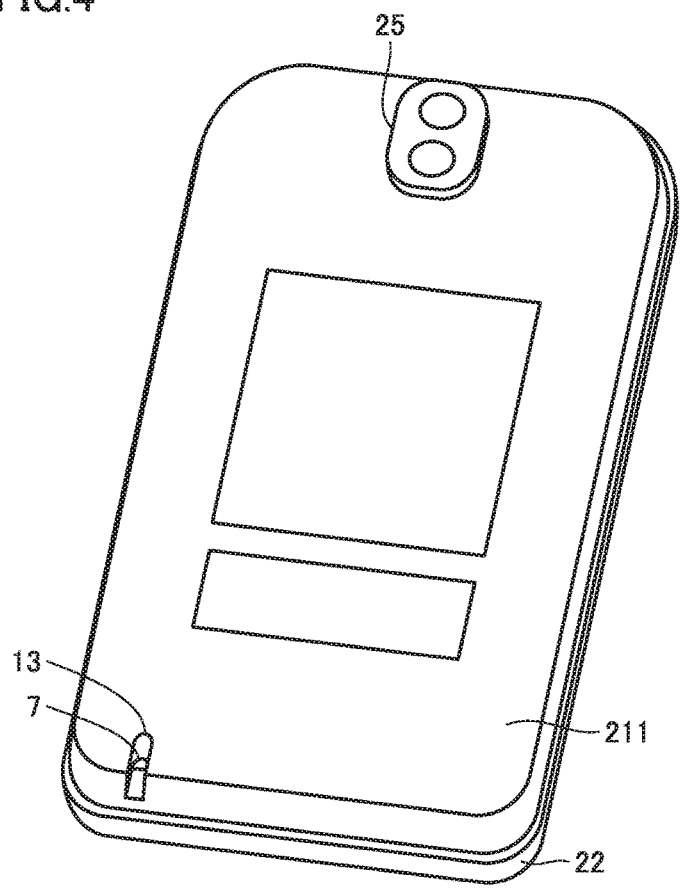
FIG. 4 is a perspective view of the electronic device shown in FIG. 1 from which a second housing component has been removed.
Figure 5:
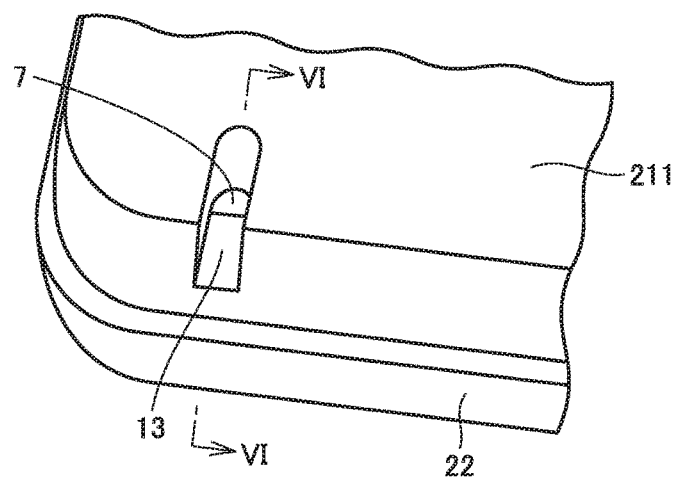
FIG. 5 is a partially enlarged perspective view of and around a first slot formed in the electronic device according to the first embodiment based on the present disclosure.
Figure 6:
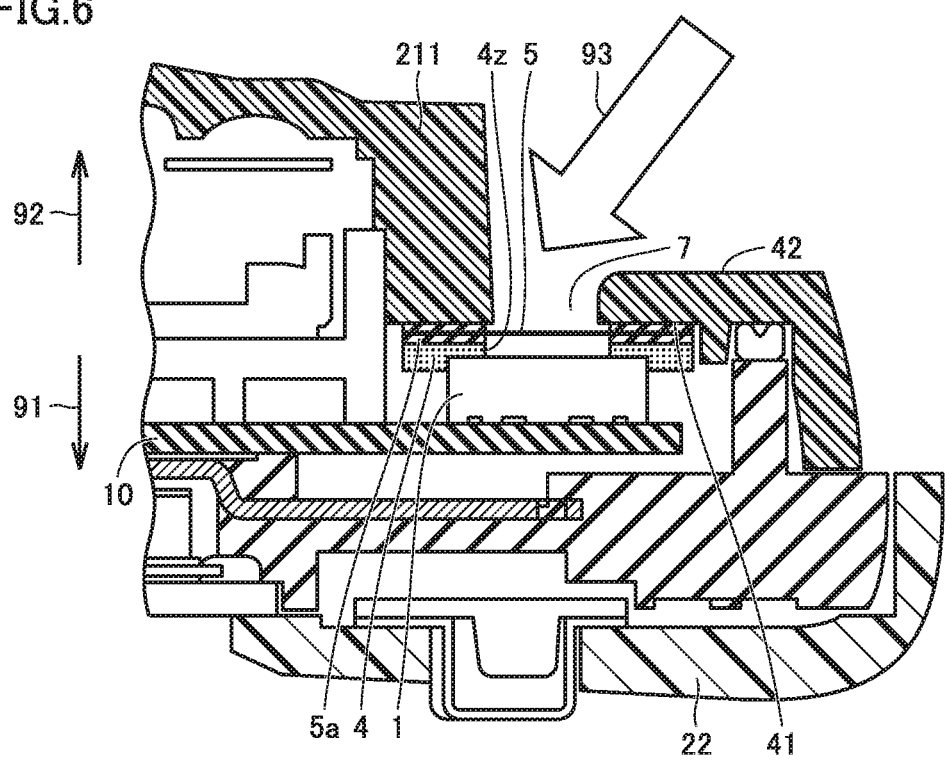
FIG. 6 is a sectional view taken along the line VI-VI in FIG. 5.

FIG. 4 shows electronic device 101 shown in FIG. 1 from which second housing component 212 has been removed. With second housing component 212 removed, first housing component 211 is visible. A first slot 13 is located in a part of first housing components 211. A first through-hole 7 is located on an extension of first slot 13. The position of first slot 13 corresponds to the position of first opening 6 shown in FIGS. 1 and 2. FIG. 5 is an enlarged view of first slot 13 shown in FIG. 4 and its surroundings. FIG. 6 is a sectional view taken along the line VI-VI in FIG. 5.

As shown in FIG. 3, electronic device 101 according to the first embodiment includes first housing component 211 and second housing component 212. First housing component 211 includes a first surface 41 facing a first side 91 and a second surface 42 facing a second side 92, and includes first through-hole 7 connecting first surface 41 and second surface 42. Second housing component 212 is attached removably to second side 92 of first housing component 211. Electronic device 101 also includes waterproof film 5 located to cover first through-hole 7 and audio component 1 located on first side 91 of waterproof film 5. As shown in FIG. 6, first through-hole 7 has such a shape that waterproof film 5 is directly visible when first side 91 is seen from second side 92 without second housing component 212 attached to first housing component 211. As shown in FIG. 3, first housing component 211 and second housing component 212 are combined together to form a passage 8 leading outward from an end of first through-hole 7 on second side 92.

Figure 7:
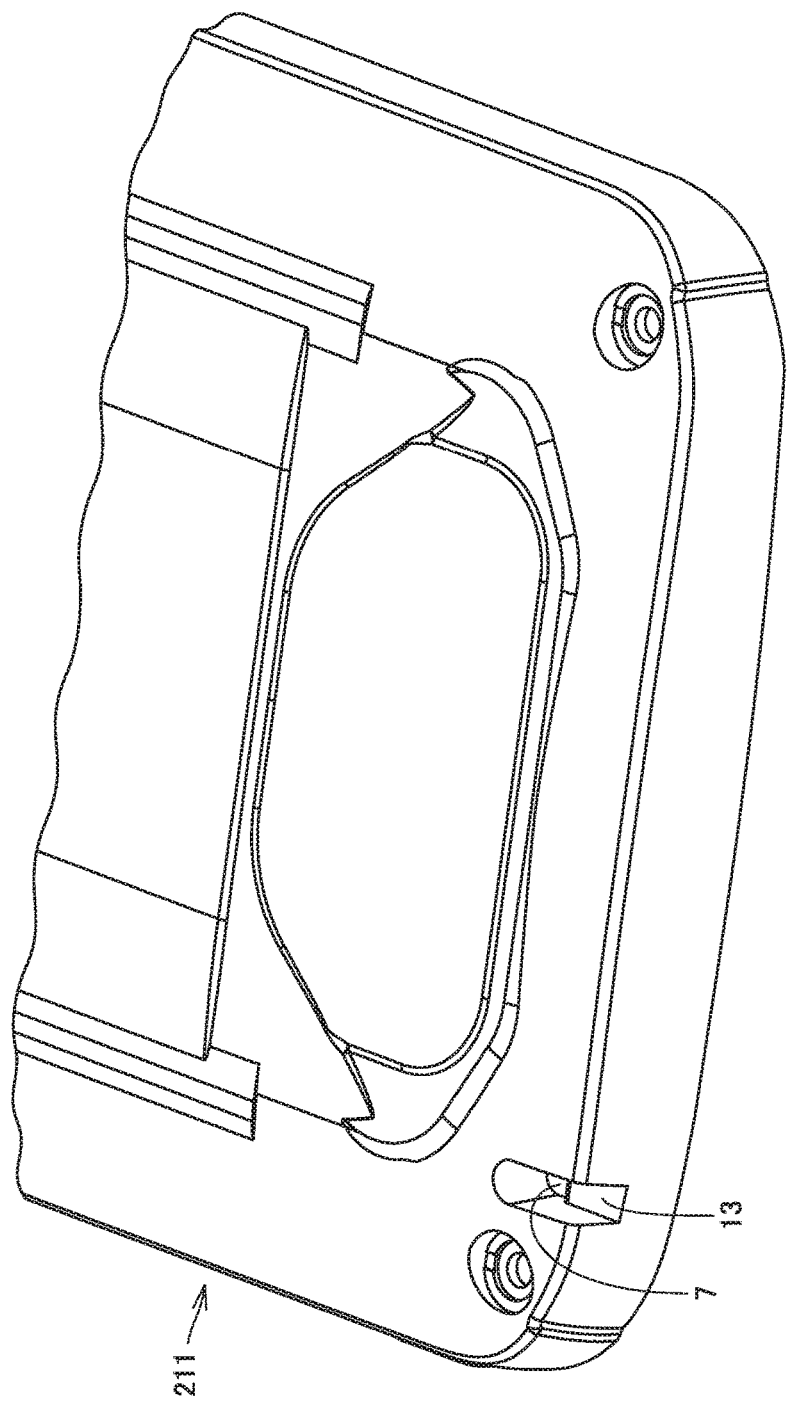
FIG. 7 is a partial perspective view of a first housing component included in the electronic device according to the first embodiment based on the present disclosure, taken out alone and seen in a first direction.
Figure 8:
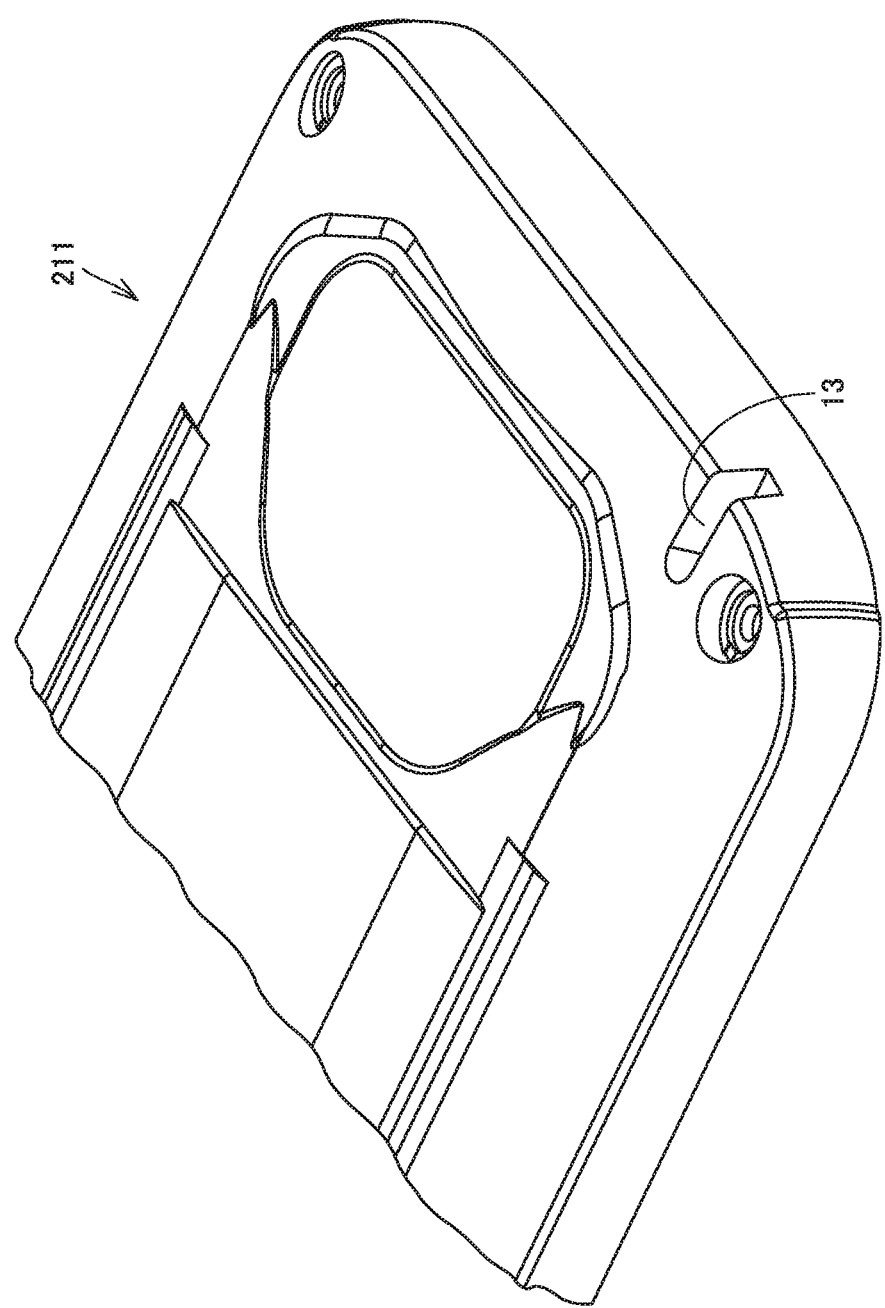
FIG. 8 is a partial perspective view of the first housing component included in the electronic device according to the first embodiment based on the present disclosure, taken out alone and seen in a second direction.

FIG. 7 shows first housing component 211 taken out alone. FIG. 8 shows first housing component 211 seen in a direction different from FIG. 6.

Since first through-hole 7 has such a shape that waterproof film 5 is directly visible when first side 91 is seen from second side 92 in the first embodiment, a foreign substance, if any, adhered to the surface of waterproof film 5 can be easily washed away. The foreign substance as used herein includes dust, salt, a detergent ingredient, and the like, for example. If the electronic device is submerged in dirty water or the like, contaminations may possibly be adhered to the surface of waterproof film 5. If the electronic device is submerged in sea water or the like, salt and other ingredients may possibly be deposited on the surface of waterproof film 5. Since the surface of waterproof film 5 can be easily washed in the first embodiment, a foreign substance can easily be removed. In the electronic device according to the first embodiment, a detergent ingredient, if any, adhered to the surface of waterproof film 5 can be easily washed away. If contaminated, the electronic device can be washed with a detergent.

In the first embodiment, since second housing component 212 is detachable from first housing component 211, and first housing component 211 and second housing component 212 are combined together to form passage 8 leading outward, waterproof film 5 does not need to be directly visible with first housing component 211 and second housing component 212 combined together. This increases the degree of freedom in design of the position of the exit of passage 8, namely, an opening through which sound comes in and out for the audio component.

When washing electronic device 101 by way of a detergent, it should be washed with second housing component 212 removed. Particularly when washing away the detergent, water should be thrown with second housing component 212 removed. At least with second housing component 212 removed, first through-hole 7 has such a shape that waterproof film 5 is directly visible when first side 91 is seen from second side 92. Thus, any undesirable substance adhered to waterproof film 5 can easily be washed away by throwing water.

Figure 9:
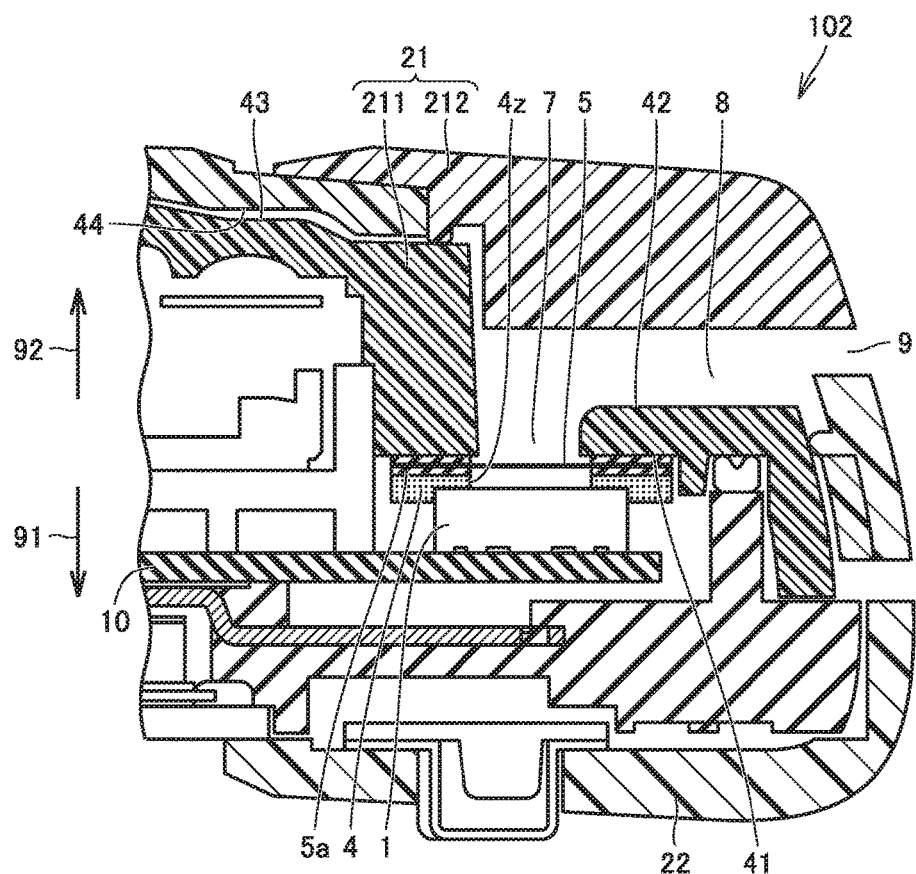
FIG. 9 is a partial sectional view of a variation of the electronic device according to the first embodiment based on the present disclosure.

As shown in FIGS. 1 to 3, second housing component 212 may include first opening 6 which opens outward, and passage 8 may lead outward via first opening 6. By employing this structure, passage 8 can be located at a desired position of second housing component 212 so as to lead outward. When second housing component 212 does not include first opening 6, an electronic device 102 having a structure as shown in FIG. 9 can be conceived. In electronic device 102, second housing component 212 does not include an opening by itself, but first housing component 211 and second housing component 212 are combined together to form an exit 9 of passage 8 on the boundary between first housing component 211 and second housing component 212. In order to obtain such exit 9, a notch may be located in at least one of first housing component 211 and second housing component 212, for example, and a certain opening may be formed when combining them together.

As described in the first embodiment, first housing component 211 may include first slot 13 on second side 92, and first slot 13 may connect with first through-hole 7. By employing this structure, voice can be guided along first slot 13. When audio component 1 is a device for picking up voice, such as a microphone, for example, voice entered via first opening 6 can be guided to first through-hole 7 along first slot 13 even if first through-hole 7 is apart from first opening 6. When audio component 1 is a device for producing sound, such as a speaker, for example, sound produced from audio component 1 can be guided to first opening 6 along first slot 13 even if first through-hole 7 is apart from first opening 6.

As described in the first embodiment, the inner surface of passage 8 may include a part of the inner surface of first slot 13. By employing this structure, passage 8 can be easily formed.

In the example shown here, waterproof film 5 covers first through-hole 7 by being located on first side 91 of first through-hole 7 as shown in FIG. 3, but such a manner of covering is not a limitation. For example, waterproof film 5 may be located on second side 92 of first through-hole 7. Waterproof film 5 may be located on second surface 42 rather than on first surface 41. Waterproof film 5 may be located at any position inside first through-hole 7.

In the example shown here, housing components 21 and 22 are combined together to form housing 20, and housing component 21 includes first housing component 211 and second housing component 212, as shown in FIGS. 1 to 3, but such a structure is not a limitation. For example, a portion corresponding to first housing component 211 may be a part of housing component 22. In that case, housing component 21 includes second housing component 212, but does not include first housing component 211. In the example shown here, housing component 21 shall be a component on the rear side of the electronic component and housing component 22 shall be a component on the front side of the electronic component, but this combination may be reversed.

Second Embodiment

Referring to FIGS. 10 to 14 in addition to FIGS. 1 to 8, an electronic device according to a second embodiment based on the present disclosure will be described. Since the basic structure of the electronic device according to the second embodiment is similar to that described in the first embodiment, description thereof will not be repeated. The description in the first embodiment with reference to FIGS. 1 to 8 also applies to the electronic device according to the second embodiment.

In the second embodiment, a specific rib is located on the rear surface of second housing component 212. A detailed description will be given below.

Figure 10:
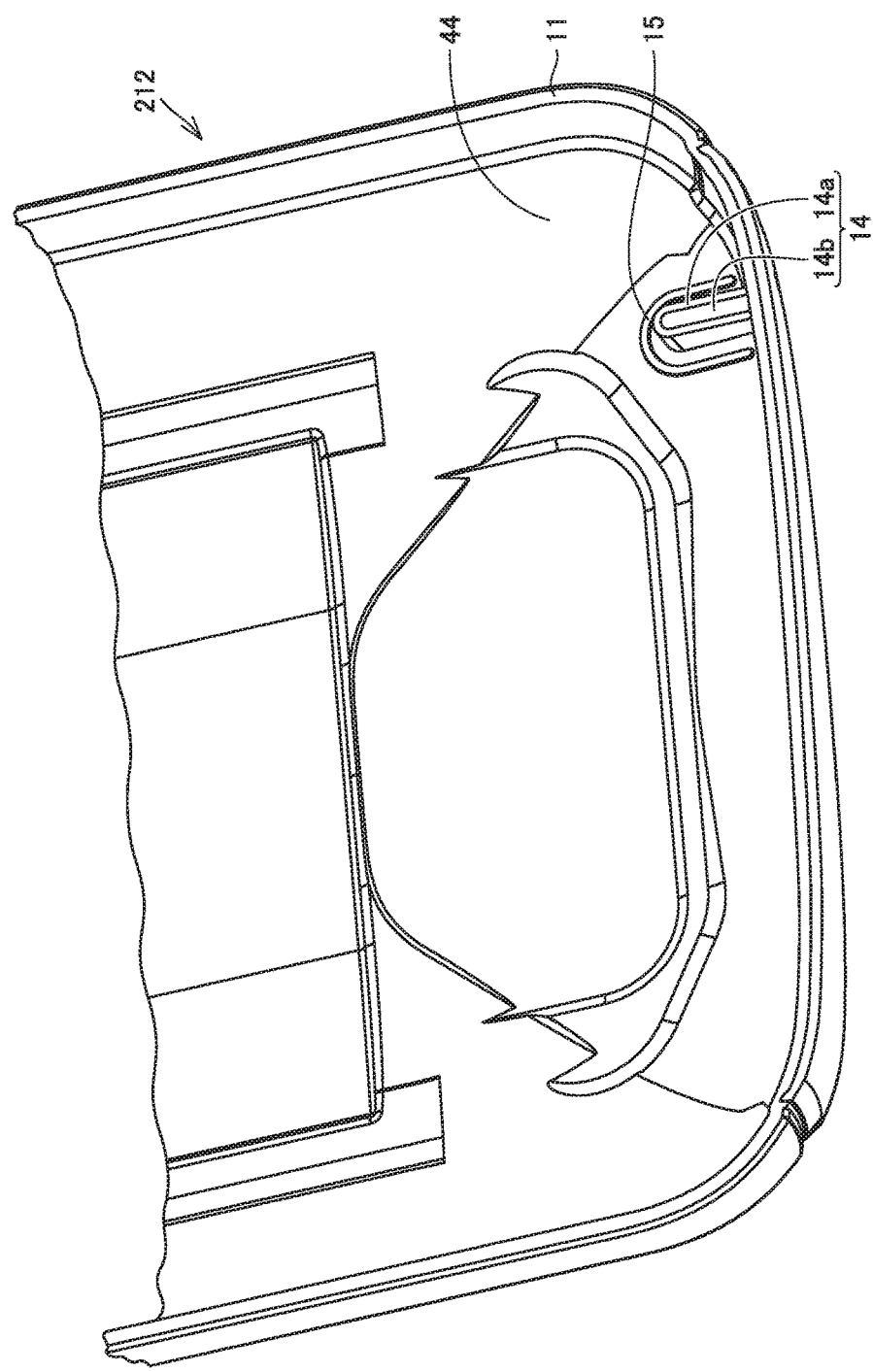
FIG. 10 is a partial perspective view of a second housing component included in an electronic device according to a second embodiment based on the present disclosure, taken out alone, with the back side seen in the first direction.
Figure 11:
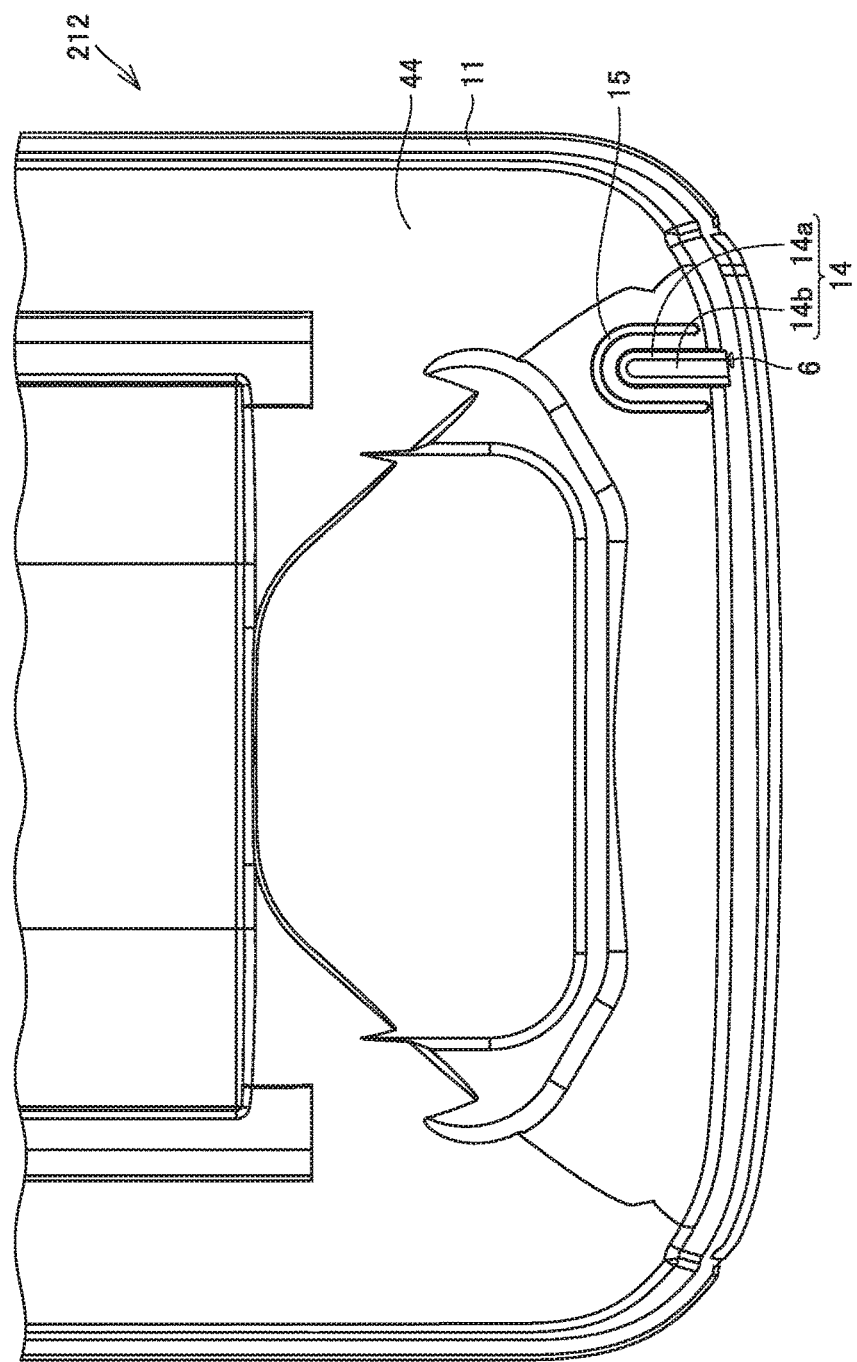
FIG. 11 is a partial plan view of the second housing component included in the electronic device according to the second embodiment based on the present disclosure, taken out alone, with the back side seen in the perpendicular direction.
Figure 12:
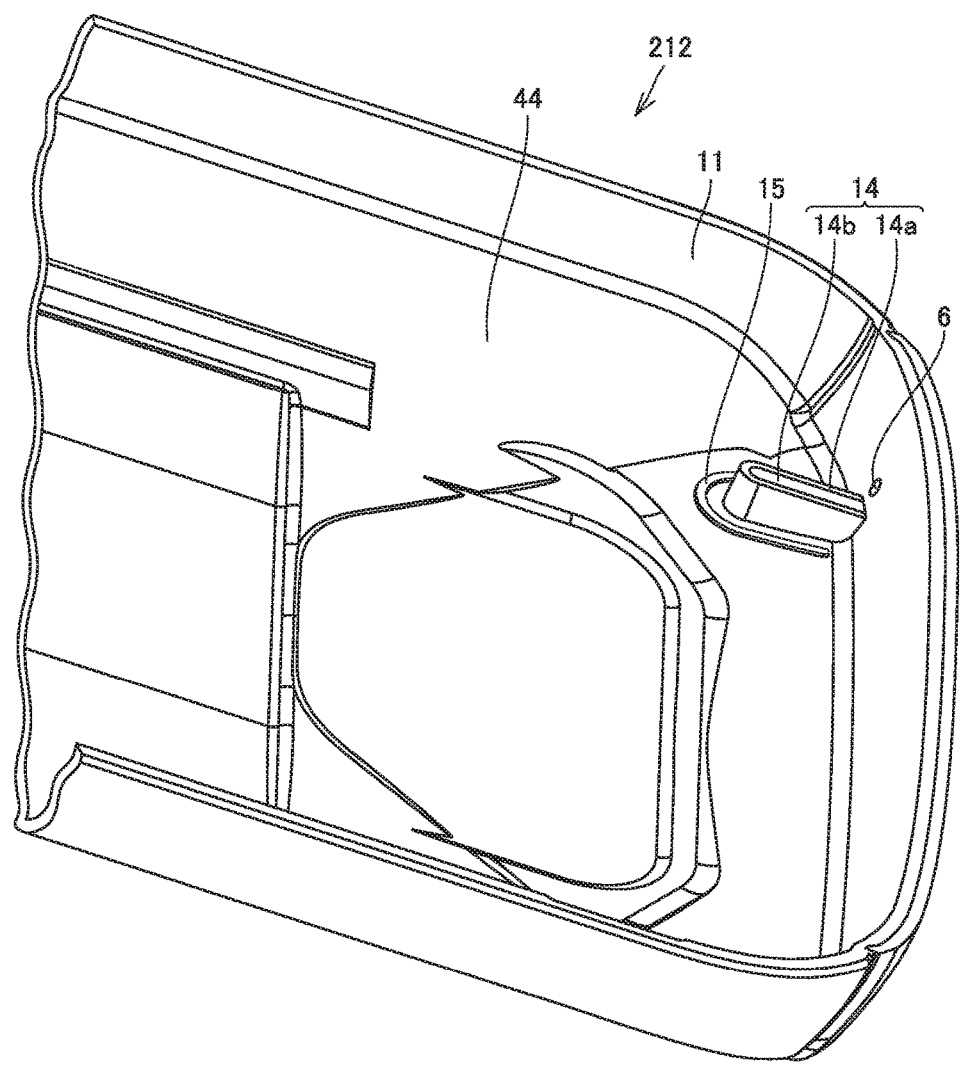
FIG. 12 is a partial perspective view of the second housing component included in the electronic device according to the second embodiment based on the present disclosure, taken out alone, with the back side seen in the second direction.

FIG. 10 shows second housing component 212 included in the electronic device according to the second embodiment, taken out alone, and seen from the back side. FIG. 11 shows second housing component 212 as seen from the back side in the perpendicular direction thereof. FIG. 12 shows second housing component 212 as seen in a further different direction.

Second housing component 212 includes a sidewall 11. First opening 6 is located in sidewall 11. The inside surface surrounded by sidewall 11 of second housing component 212 is a fourth surface 44. A protrusion 14 is located on the inner side of sidewall 11 at a position corresponding to first slot 13 when second housing component 212 is attached to first housing component 212. In the example shown here, protrusion 14 is formed to connect with sidewall 11. Protrusion 14 includes a first material portion 14a and a second material portion 14b, for example. Second material portion 14b is located so as to be surrounded by first material portion 14a. First material portion 14a and second material portion 14b are formed integrally by double molding, for example Protrusion 14 may be made of a single material. Protrusion 14 has a wall shape. Protrusion 14 has a shape that can be fitted within first slot 13. The thickness of protrusion 14 is a smaller than the width of first slot 13. First opening 6 is located on the central line of protrusion 14.

A rib 15 is located so as to surround protrusion 14. Rib 15 may be separated from protrusion 14. In the example shown here, rib 15 has a U shape. The height of rib 15 as seen from fourth surface 44 is lower than the height of protrusion 14.

Figure 13:
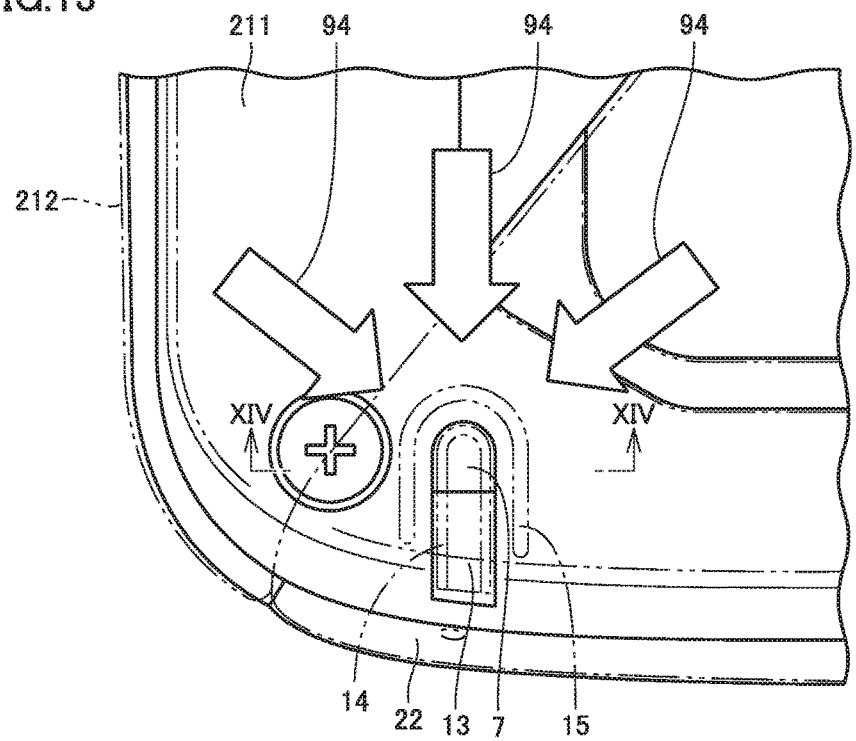
FIG. 13 is a partially enlarged perspective view of the electronic device according to the second embodiment based on the present disclosure.
Figure 14:
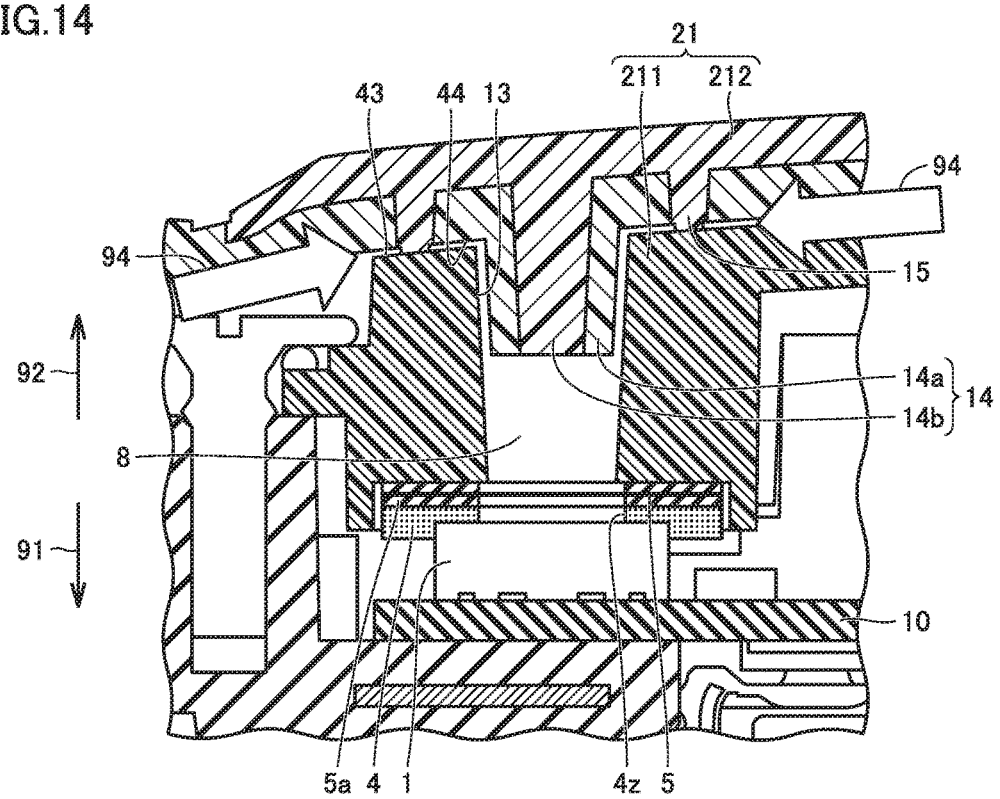
FIG. 14 is a sectional view taken along the line XIV-XIV in FIG. 13.

FIG. 13 is an enlarged view of the electronic device according to the second embodiment. FIG. 13 shows second housing component 212 perspectively. In FIG. 13, second housing component 212 is indicated by the chain double-dashed line, and first housing component 211 is indicated by the solid line. In the example shown here, rib 15 has a U shape that surrounds first slot 13. FIG. 14 is a sectional view taken along the line XIV-XIV in FIG. 13. Protrusion 14 located in second housing component 212 is fitted within first slot 13 located in first housing component 211. With protrusion 14 closing almost half of the upper part of the internal space of first slot 13 shown in FIG. 14, almost half of the lower part is left open to form passage 8. In FIG. 14, passage 8 extends in the direction perpendicular to the sheet of drawing.

As shown in FIG. 14, first housing component 211 includes a third surface 43 facing second side 92, and second housing component 212 includes fourth surface 44 opposed to third surface 43. Rib 15 protruding to come into contact with third surface 43 is located on fourth surface 44. Rib 15 is located to separate the area including first through-hole 7 from the remaining area.

Alternatively, the following structure may be adopted when there is first slot 13. First housing component 211 includes third surface 43 facing second side 92, and second housing component 212 includes fourth surface 44 opposed to third surface 43. Rib 15 protruding to come into contact with third surface 43 is located on fourth surface 44. Rib 15 is located to separate the area including first through-hole 7 and first slot 13 from the remaining area.

In the example shown in FIG. 14, second housing component 212 is formed by double molding. Second housing component 212 is formed by a combination of a rigid material and a soft material. The rigid material as used herein may be polycarbonate resin, for example. The soft material as used herein may be elastomer, for example. Since the leading end of rib 15 comes into contact with third surface 43, rib 15 may be made of a soft material. Rib 15 may be made of an elastic material. Protrusion 14 may include first material portion 14a and second material portion 14b. First material portion 14a may be made of a rigid material, and second material portion 14b may be made of a soft material.

Since rib 15 is formed in the second embodiment, even if sound produced at any place in the housing propagates along the gap between first housing component 211 and second housing component 212 as indicated by an arrow 94 shown in FIGS. 13 and 14, rib 15 prevents that sound from entering first through-hole 7 or first through-hole 7 and first slot 13. Thus, an undesirable sound can be prevented from being picked up by audio component 1 even if audio component 1 is a device having the function of picking up sound, such as a microphone, for example.

According to the second embodiment, no new component is required since the effect can be acquired provided that second housing component 212 includes a rib. It is possible to avoid the number of components from increasing.

The "sound produced at any place in the housing" not only includes sound produced by any device located in the electronic device, but also sound produced when a user touches the outer surface of the housing, namely, the outer surface of second housing component 212. This also applies to a third embodiment which will be described later.

Third Embodiment

Figure 15:
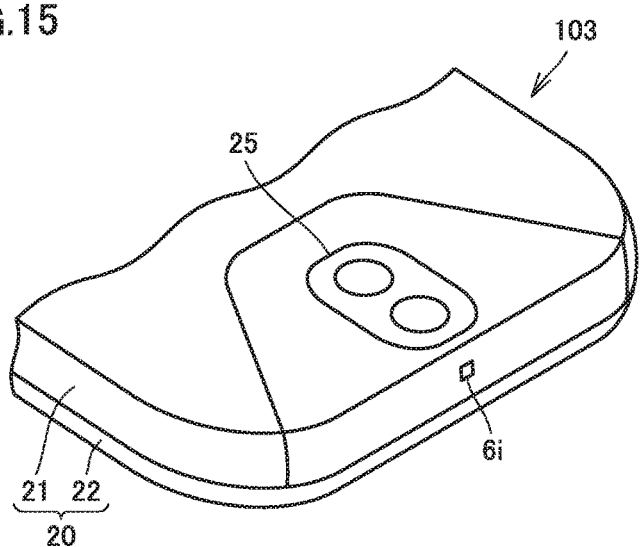
FIG. 15 is a partial perspective view of an electronic device according to a third embodiment based on the present disclosure.
Figure 16:
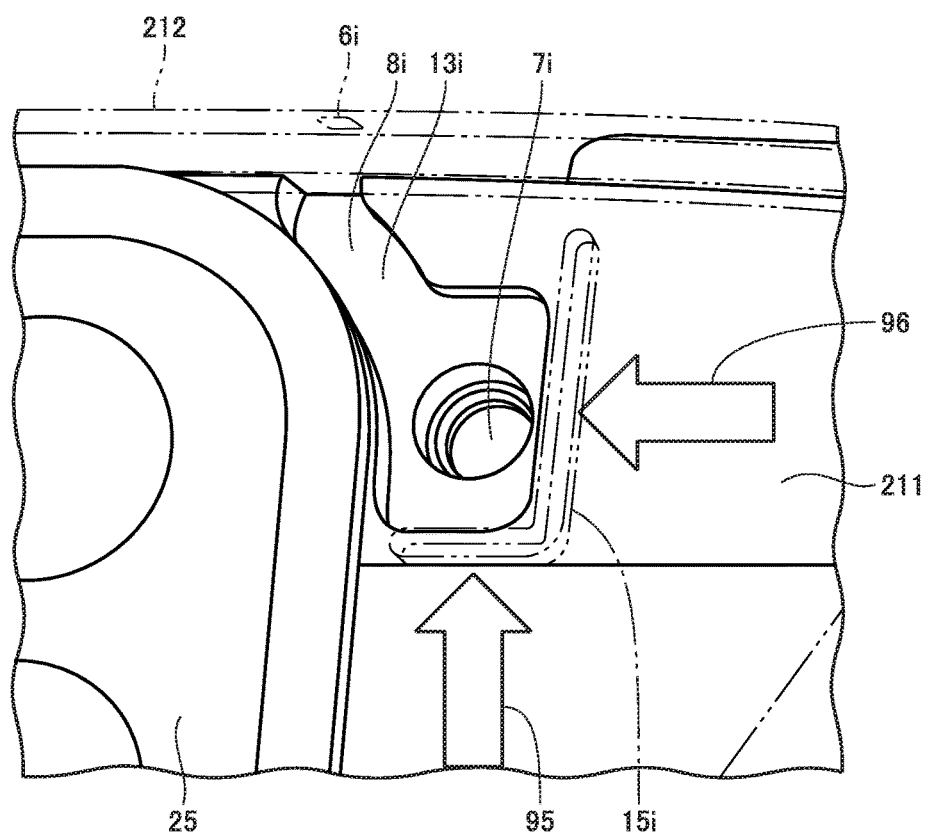
FIG. 16 is a partially enlarged perspective view of the electronic device according to the third embodiment based on the present disclosure.

Referring to FIGS. 15 and 16, an electronic device according to a third embodiment based on the present disclosure will be described. Since the basic structure of the electronic device according to the third embodiment is similar to that described in the first embodiment, description thereof will not be repeated.

FIG. 15 shows a part of the electronic device according to the third embodiment. An electronic device 103 includes housing 20. Housing 20 includes housing components 21 and 22. Electronic device 103 includes image capturing unit 25. A first opening 6i is located in a side surface of housing component 21. In the example shown here, first opening 6i is located at a position close to image capturing unit 25. This is merely an example, and the position where first opening 6i is located is not limited to such a position. The presence of image capturing unit 25 is nonessential, and is merely illustrated for ease of description.

Of electronic device 103, first opening 6i and its surroundings are shown in FIG. 16 such that second housing component 212 is seen perspectively. In FIG. 16, second housing component 212 is indicated by the chain double-dashed line, and first housing component 211 is indicated by the solid line. Housing component 21 includes first housing component 211 and second housing component 212. First opening 6i is located in a sidewall of second housing component 212. A first slot 13i and a first through-hole 7i are located in first housing component 211. First slot 13i is located to connect first opening 6i and first through-hole 7i. First slot 13i is closed by second housing component 212 to form a passage 8i.

A rib 15i is located in a surface of second housing component 212 opposed to first housing component 211. Rib 15i has an L shape. The neighborhood of first through-hole 7i of first housing component 211 is a recess over a generally rectangular area. First slot 13i connects with this recess. Rib 15i is located along two sides of this recess on the side distant from first slot 13i.

Since rib 15i is formed in the third embodiment, even if sound produced at any place in the housing propagates along the gap between first housing component 211 and second housing component 212 as indicated by arrows 95 and 96 shown in FIG. 16, rib 15i prevents that sound from entering first through-hole 7i and the recess in its neighborhood. Thus, an undesirable sound can be prevented from being picked up by audio component 1 even if audio component 1 is a device having the function of picking up sound, such as a microphone, for example. In FIG. 16, small gaps are left between the upper end of rib 15i and the outer edge of first housing component 211 and between the left end of rib 15i and image capturing unit 25. There may be such small gaps. The effect can be sufficiently acquired since rib 15i can block the major part of propagated sound with the structure shown in FIG. 16.

Audio component 1 may include a microphone. This can apply to all of the first to third embodiments. Since a microphone is a device for picking up sound, the effect is significantly acquired particularly when audio component 1 includes a microphone. The electronic device can be washed with a detergent.

In the second and third embodiments, the structures in which ribs 15 and 15i are located have been described. Such a structure in which a rib is formed for preventing sound transmitted along gaps between the housing components from entering the audio component is not limited to the electronic device having a structure as described in the first embodiment, but can also be applied to a wider range of electronic devices.

Such a structure including a rib can also be applied to the following electronic device, for example.

An electronic device includes first housing component 211 and second housing component 212. First housing component 211 includes first surface 41 facing first side 91 and second surface 42 facing second side 92, and includes first through-hole 7 connecting first surface 41 and second surface 42. Second housing component 212 is attached removably to second side 92 of first housing component 211. Electronic device 101 also includes waterproof film 5 located to so as close first through-hole 7 on the first surface 41 side, as well as audio component 1 located on first side 91 of waterproof film 5. Alternatively, audio component 1 may be located to so as close first through-hole 7 on the first surface 41 side, without forming waterproof film 5. Second housing component 212 includes first opening 6 opened outward. First housing component 211 and second housing component 212 are combined together to form passage 8 leading to first opening 6 from the end of first through-hole 7 on the second surface 42 side. The rib structure is applicable regardless of whether or not first through-hole 7 has such a shape that waterproof film 5 is directly visible when first side 91 is seen from second side 92. The second and third surfaces may be different surfaces, or may be an identical surface.

Some of the above-described embodiments combined as appropriate may be adopted.

The term "electronic device" as used herein has a broad concept including, for example, a mobile phone, a personal digital assistant, a tablet terminal, a personal computer, a game machine, a television set, a portable music player, a CD (compact disc) player, a DVD (digital versatile disc) player, an electronic calculator, an electronic notebook, an electronic dictionary, a digital book reader, a digital camera, a video camera, a radio set, a navigation system, a measuring instrument, and the like. A smartphone is included in the concept of a mobile phone or a personal digital assistant.

Although the present disclosure has been described and illustrated in detail, it is clearly understood that the same is by way of illustration and example only and is not to be taken by way of limitation, the scope of the present disclosure being interpreted by the terms of the appended claims.

The invention claimed is:
1. An electronic device comprising:
 a first housing component including a first surface facing a first side and a second surface facing a second side, the first housing component including a first through-hole configured to connect the first surface and the second surface;
 a waterproof film located to cover the first through-hole;
 an audio component located on the first side of the waterproof film; and
 a second housing component attached removably to the second side of the first housing component,
 the first through-hole having such a shape that the waterproof film is directly visible when the first side is seen from the second side without the second housing component attached to the first housing component,
 the waterproof film is not directly visible from outside with the second housing component attached to the first housing component when viewed from the second side towards the first side, the first housing component and the second housing component being combined together to form a passage leading outward from an end of the first through-hole on the second side.

2. The electronic device according to claim 1, wherein
the second housing component includes a first opening which is opened outward, and
the passage leads outward via the first opening.

3. The electronic device according to claim 1, wherein
the first housing component includes a first slot on the second side, and
the first slot connects with the first through-hole.

4. The electronic device according to claim 3, wherein an inner surface of the passage includes a part of an inner surface of the first slot.

5. The electronic device according to claim 3, wherein
the first housing component includes a third surface facing the second side, and the second housing component includes a fourth surface opposed to the third surface, and
a rib protruding to come into contact with the third surface is located on the fourth surface, the rib separating an area including the first through-hole and the first slot from another area.

6. The electronic device according to claim 1, wherein
the first housing component includes a third surface facing the second side, and the second housing component includes a fourth surface opposed to the third surface, and
a rib protruding to come into contact with the third surface is located on the fourth surface, the rib separating an area including the first through-hole from another area.

7. The electronic device according to claim 1, wherein the audio component includes a microphone.

8. The electronic device according to claim 1, wherein a penetrating direction of the first through-hole of the first housing component is different from a penetrating direction of the passage leading outward from the end of the first through-hole on the second side.

* * * * *